(12) United States Patent
Ni et al.

(10) Patent No.: US 7,077,971 B2
(45) Date of Patent: Jul. 18, 2006

(54) METHODS FOR DETECTING THE ENDPOINT OF A PHOTORESIST STRIPPING PROCESS

(75) Inventors: Tuqiang Ni, Fremont, CA (US); Wenli Collison, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 409 days.

(21) Appl. No.: 10/163,286

(22) Filed: Jun. 4, 2002

(65) Prior Publication Data

US 2002/0148811 A1  Oct. 17, 2002

Related U.S. Application Data

(62) Division of application No. 09/468,742, filed on Dec. 21, 1999, now Pat. No. 6,451,158.

(51) Int. Cl.
- *G01N 21/00* (2006.01)
- *H01L 21/00* (2006.01)
- *H01L 21/302* (2006.01)

(52) U.S. Cl. ............... 216/60; 216/59; 438/8; 438/16; 438/725

(58) Field of Classification Search .......... 216/60, 216/59; 438/725, 906, 8, 9, 16
See application file for complete search history.

(56) References Cited

U.S. PATENT DOCUMENTS

| | | | | |
|---|---|---|---|---|
| 3,647,387 A | | 3/1972 | Benson et al. | 23/232 R |
| 4,201,579 A | | 5/1980 | Robinson et al. | 430/323 |
| 4,245,154 A | * | 1/1981 | Uehara et al. | 204/192.32 |
| 4,312,732 A | * | 1/1982 | Degenkolb et al. | 216/60 |
| 4,528,438 A | | 7/1985 | Poulsen et al. | 219/121 |
| 4,699,689 A | * | 10/1987 | Bersin | 438/709 |
| 4,812,201 A | | 3/1989 | Sakai et al. | 156/643 |
| 5,284,547 A | * | 2/1994 | Watanabe | 118/712 |
| 5,308,447 A | * | 5/1994 | Lewis et al. | 216/23 |
| 5,453,157 A | * | 9/1995 | Jeng | 438/702 |
| 5,499,733 A | * | 3/1996 | Litvak | 216/38 |
| 5,672,239 A | | 9/1997 | DeOrnellas | 156/625.1 |
| 5,795,831 A | | 8/1998 | Nakayama et al. | 438/714 |
| 5,871,658 A | * | 2/1999 | Tao et al. | 216/59 |
| 5,882,489 A | | 3/1999 | Bersin et al. | 204/192.35 |
| 5,969,805 A | * | 10/1999 | Johnson et al. | 356/72 |
| 6,154,284 A | | 11/2000 | McAndrew et al. | 356/437 |
| 6,207,008 B1 | * | 3/2001 | Kijima | 216/59 |
| 6,265,316 B1 | * | 7/2001 | Yoshida | 438/700 |
| 6,335,531 B1 | * | 1/2002 | Somerville et al. | 250/459.1 |
| 6,451,158 B1 | * | 9/2002 | Ni et al. | 156/345.12 |
| 2002/0093642 A1 | * | 7/2002 | Eyolfson et al. | 356/72 |
| 2002/0148811 A1 | * | 10/2002 | Ni et al. | 216/59 |

FOREIGN PATENT DOCUMENTS

| | | |
|---|---|---|
| EP | 0768701 A1 | 4/1997 |
| JP | 60-136229 A * | 7/1985 |
| JP | 4-164316 A * | 6/1992 |
| WO | WO 97/04476 | 2/1997 |

OTHER PUBLICATIONS

Patent Abstracts of Japan, vol. 014, No. 489 (E–0994), Oct. 24, 1990 & JP 02 201924 (Dainippon Screen Mfg. Co. Ltd.), Aug. 10, 1990.

Patent Abstracts of Japan, vol. 013, No. 319 (P–901), Jul. 19, 1989 & JP 01 088344 A (Shimadzu Corp.), Apr. 3, 1989.

* cited by examiner

*Primary Examiner*—Jeffrie R. Lund
(74) *Attorney, Agent, or Firm*—Martine Penilla & Gencarella, LLP

(57) ABSTRACT

Methods for detecting the endpoint of a photoresist stripping process provide O for reaction with the photoresist for a wafer to be stripped of photoresist. NO is also supplied for reaction with O not reacted with the photoresist. After substantially all the photoresist is stripped from the wafer, the rate of a reaction of O and NO to form $NO_2$ increases, which increases the intensity of emitted light. An operation of detecting this increase in light intensity signals the endpoint of the photoresist stripping process.

25 Claims, 6 Drawing Sheets

METHODS FOR DETECTING THE ENDPOINT OF A PHOTORESIST STRIPPING PROCESS

CROSS-REFERENCE TO RELATED APPLICATION

This Application is a divisional of prior application Ser. No. 09/468,742, filed Dec. 12, 1999 now U.S. Pat. No. 6,451,158 from which priority under 35 U.S.C. Section 120 is claimed. The entire disclosure of the prior application from which a copy of the declaration is herewith supplied is considered as being part of the disclosure of this Application and is hereby incorporated by reference therein.

BACKGROUND OF THE INVENTION

This disclosure relates generally to photoresist stripping processes, and more particularly to a method and apparatus for detecting the endpoint of a photoresist stripping process.

Fabrication of integrated circuits generally starts with a thin slice of silicon called a wafer. On this wafer one can fabricate several hundred individual chips. Each chip may contain 10 to 20,000 components for a total of several million devices per wafer. The devices include resistors, diodes, capacitors and transistors of various types. The fabrication of the devices includes depositing desired materials (such as silicon dioxide, aluminum, etc.) at certain locations.

A technique called photolithography is used to facilitate the introduction of materials at desired locations on the wafer and the removal of undesired material at other locations. As an example, a layer of aluminum is first deposited on the wafer. Next, the wafer is coated with a light sensitive polymer called photoresist. A mask is used to expose selected areas of photoresist to UV light. The UV light induces polymerization in the exposed photoresist. UV light causes the exposed photoresist to cross link, rendering it insoluble in developing solution. Such a photoresist is called a positive photoresist. A negative photoresist shows an opposite behavior. That is, exposure to UV makes the photoresist soluble in developing solution. After the exposure to light, the soluble portions of the photoresist are removed, leaving a pattern of photoresist.

Immediately after photolithography, the wafer with patterned photoresist is aluminum etched to remove the aluminum where there is no pattern. This has the effect of transferring the pattern to the aluminum, creating electrical connections among devices at different locations.

After the aluminum etch process is complete, the photoresist is removed from the wafer in a process called photoresist stripping. The stripping of photoresist from the wafer surface must be essentially complete, since photoresist left on the wafer surface will cause defects in the integrated circuit. An important consideration in the photoresist stripping process is determining a time, referred to as the endpoint, at which to end the process. This time must be chosen so that the photoresist is entirely removed from the wafer. Preferably, the time will not exceed the time when the photoresist has been entirely removed, since this decreases the efficiency of the fabrication of integrated circuits.

FIG. 1 is a flow chart of a prior art method for stripping photoresist 2. The prior art method begins in a step 4. The photoresist stripping process includes introducing a flow of O atoms into a stripping chamber that holds the wafer. The O atoms react with the photoresist, removing the photoresist from the wafer. The products of this reaction are removed from the chamber in the flow of gases leaving the chamber. The prior art method 2 continues the photoresist stripping process for a predetermined time in a step 6, and ends the photoresist stripping process in a step 8 after the predetermined time elapses. The predetermined time is chosen to ensure that enough time passes to ensure that essentially all the photoresist has been stripped from the wafer.

One problem with the prior art method shown in FIG. 1 is that it provides no means of detecting if all of the photoresist has been stripped from the wafer. Even if the photoresist has not been completely stripped from the wafer, the prior art method still stops the stripping process after the predetermined time has elapsed. In such a case, the presence of photoresist on the wafer will not be discovered until later, and the wafer will either have to be put through the photoresist stripping process again or discarded. Either alternative adds expense and time to the fabrication of the integrated circuit.

Another problem with the prior art method shown in FIG. 1 is that the time of the photoresist stripping process is predetermined. As such, the time may not be optimally efficient. The time may be too short, in which case some or all of the wafers fail to be completely stripped of photoresist, requiring further processing of the wafers. Alternatively, the time may be too long, in which case the process continues after all the photoresist has been stripped from the wafer. This decreases throughput and fabrication efficiency.

It would therefore be desirable to provide a method and apparatus for detecting when essentially all the photoresist has been stripped from a wafer during the photoresist stripping process. Such a method and apparatus would preferably increase wafer fabrication throughput and efficiency.

SUMMARY OF THE INVENTION

Disclosed embodiments provide a method and apparatus for detecting the endpoint for a photoresist stripping process. Preferably, O and NO are introduced into the stripping chamber. When O and NO react, they produce $NO_2$ and emit light. However, while photoresist remains on the wafer, the O that is introduced mostly reacts with the photoresist and only a small amount of light is emitted from the O+NO reaction. After essentially all the photoresist has been stripped from the wafer, much of the O that would have reacted with the photoresist reacts with the NO instead. Thus, the rate of the O+NO reaction increases and the amount of light produced in the reaction increases. The method and apparatus detects the light emitted from the reaction of O and NO and uses the increase in the light emission levels to detect the endpoint of the photoresist stripping process.

According to a preferred embodiment, the apparatus includes a stripping chamber, a wafer disposed within the stripping chamber, and a light detecting apparatus for monitoring the intensity of light emitted within the stripping chamber. The light detecting apparatus detects the intensity of light emitted from the reaction of O and NO to form $NO_2$.

BRIEF DESCRIPTION OF THE DRAWINGS

The disclosed embodiments will be better understood when consideration is given to the following detailed description in conjunction with the accompanying drawings, with like reference numerals designating like elements.

DETAILED DESCRIPTION OF THE PREFERRED EMBODIMENTS

Figure 1:
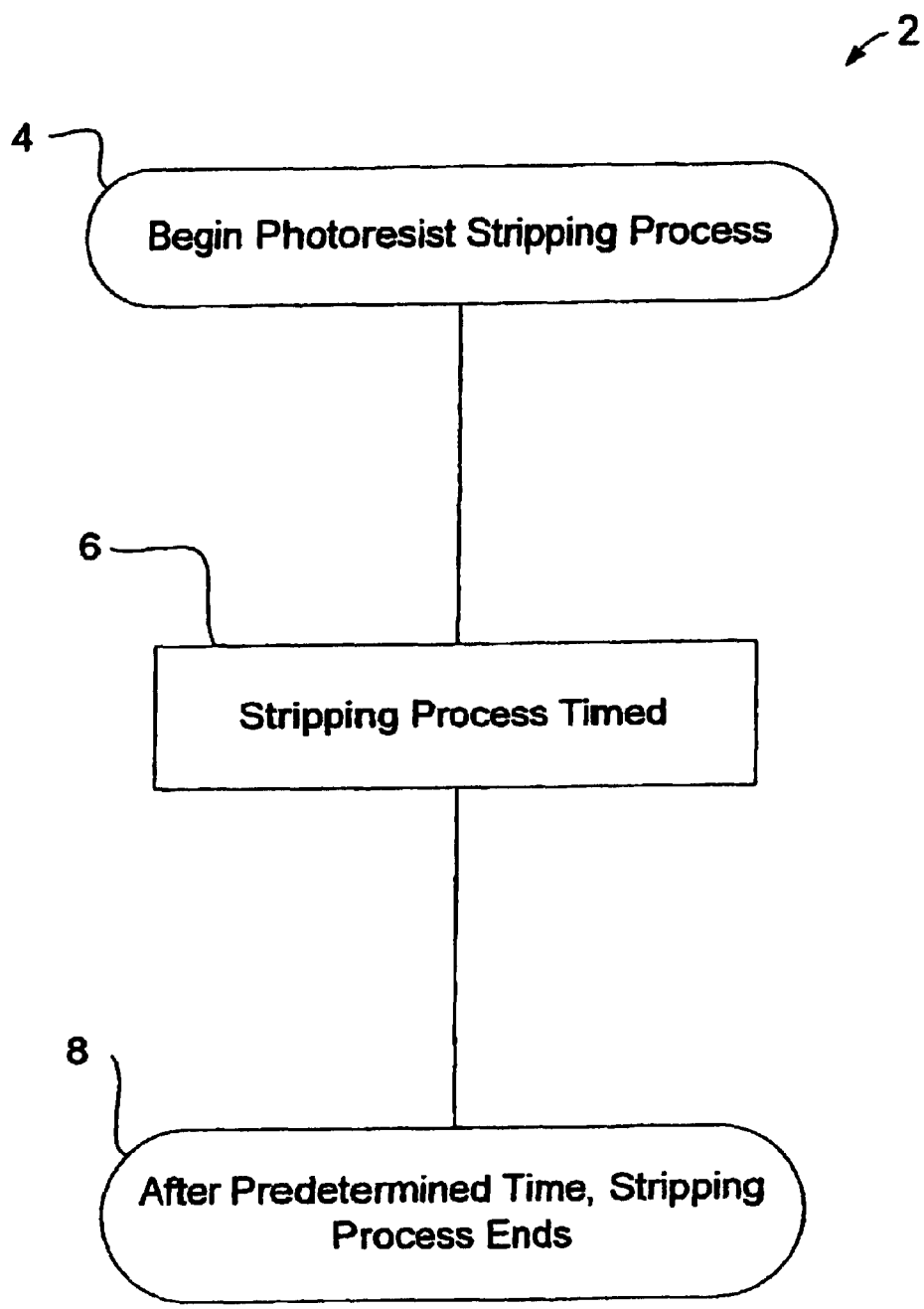
FIG. 1 is a flow chart of a prior art method for stripping photoresist.
Figure 2:
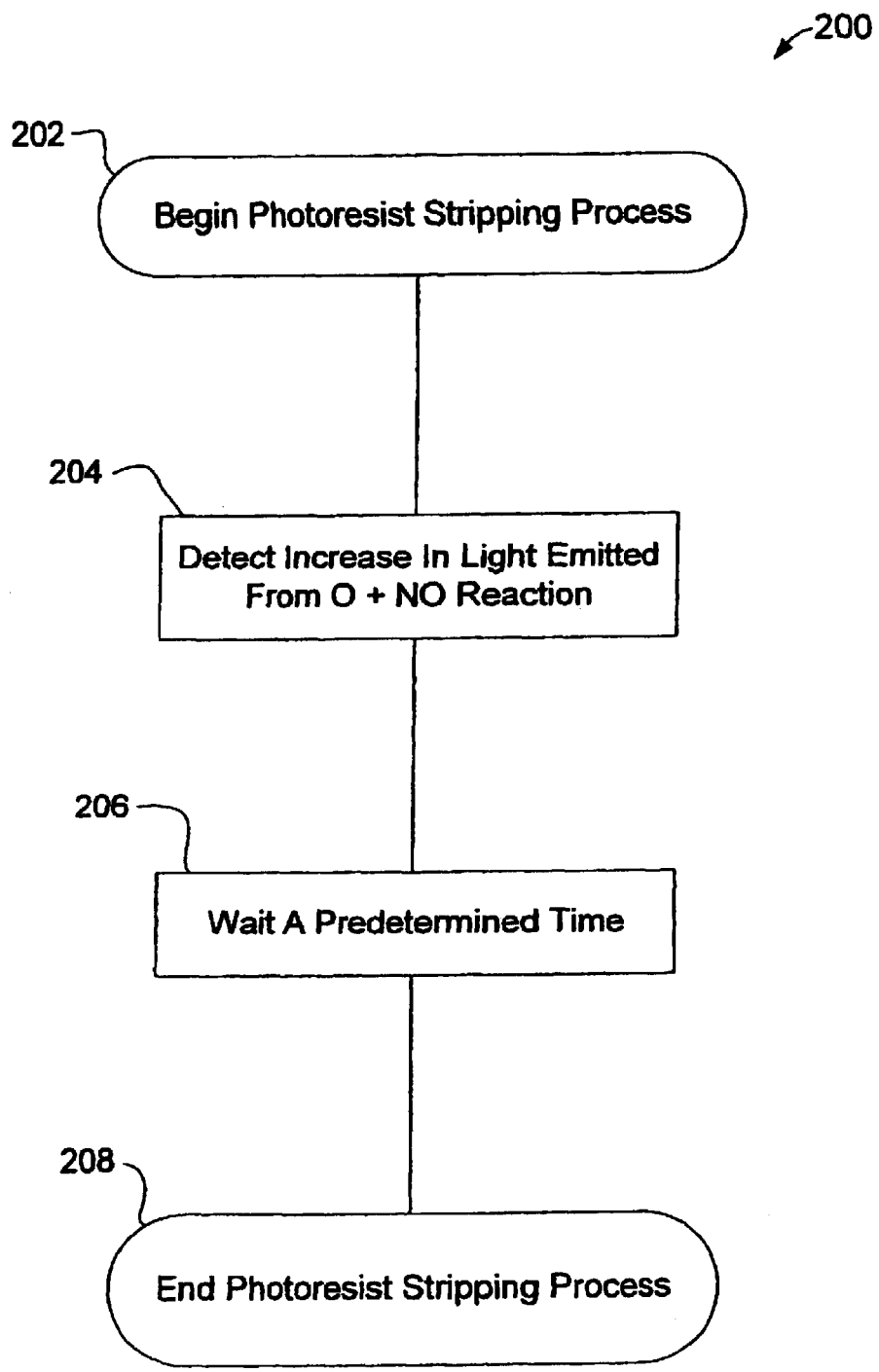
FIG. 2 is a flow chart of a method for stripping photoresist.

FIG. 2 shows a flow chart depicting the major steps of a method 200 for detecting the endpoint of a photoresist stripping process. In an initial step 202, the photoresist stripping process begins. The photoresist stripping process is detailed further in FIG. 3 and its accompanying description.

In a step 204, an increase in emitted light is detected. Preferably, the light is emitted from the reaction of O and NO to form $NO_2$. Suitable choice of an apparatus to detect the increase in emitted light, and suitable placement of the apparatus to detect the increase in emitted light are well within the capabilities of those skilled in the art of wafer processing. The increase in emitted light signals the endpoint of the photoresist stripping process.

The photoresist stripping process continues for a predetermined time in a step 206. In a preferred embodiment, the predetermined time is twenty seconds. While the increase in light emitted signals that substantially all of the photoresist has been stripped from the wafer, the extra time for the photoresist stripping process ensures that the wafer has been sufficiently stripped of photoresist.

Finally, in a step 208, the photoresist stripping process is ended. The photoresist has been stripped from the wafer and the wafer is ready for further processing.

Figure 3:
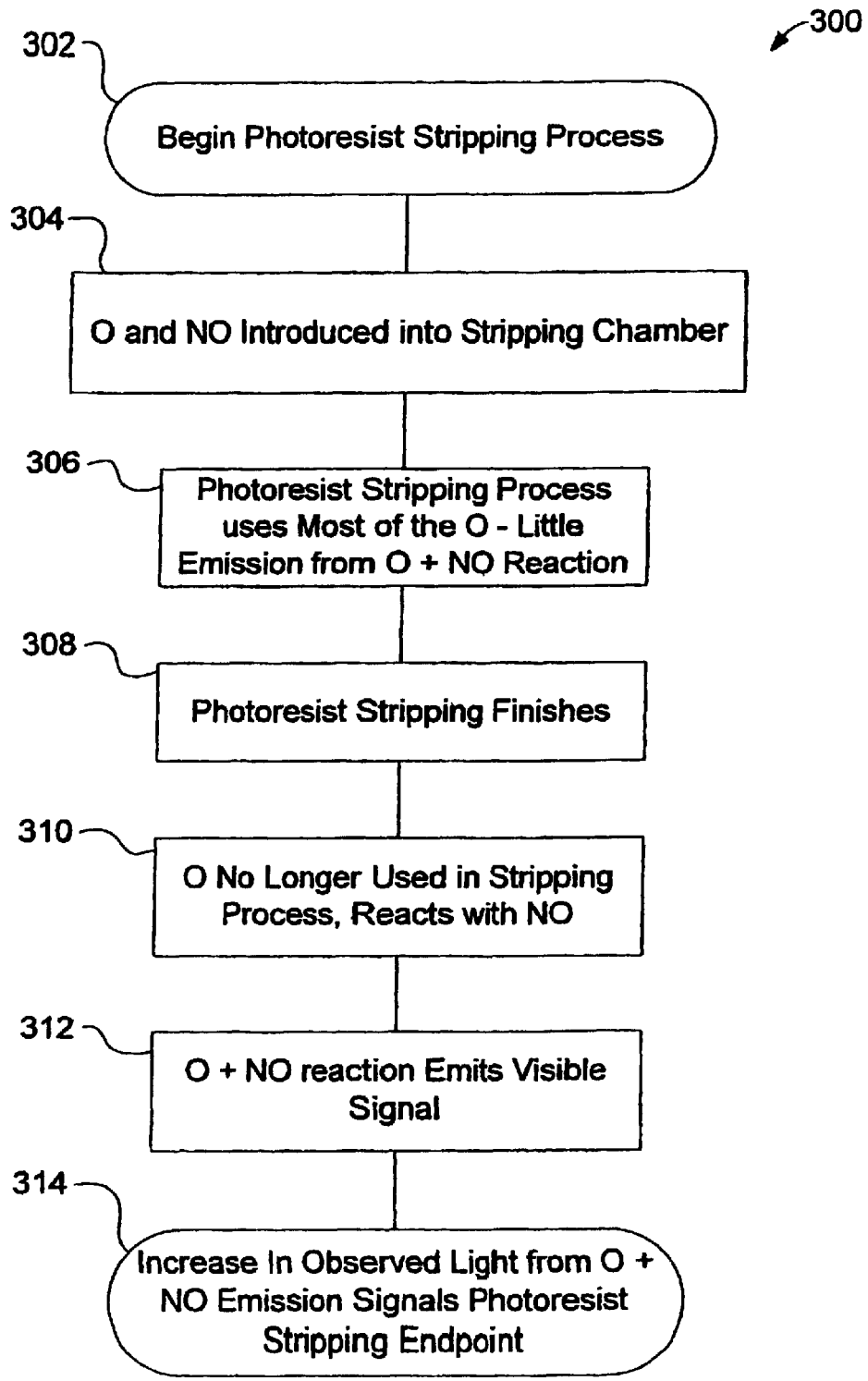
FIG. 3 is a flow chart showing the process of photoresist stripping according to an embodiment of the present invention.

FIG. 3 shows a flow chart depicting the photoresist stripping process 300 of a preferred embodiment. The photoresist stripping process 300 begins in a step 302. As the process 300 begins, O and NO are introduced into the stripping chamber in a step 304. In other embodiments, NO is not introduced into the chamber, but is introduced downstream from the stripping chamber outlet, into a flow of gas coming from the stripping chamber. In a preferred embodiment, the O and NO are produced by introducing $O_2$ and $N_2$ into a plasma chamber, dissociating the $O_2$ and $N_2$ within the plasma chamber so that a flow of O and NO forms and enters the stripping chamber, in such a manner that substantially no plasma enters the stripping chamber.

In a step 306, the photoresist is stripped from a wafer. This occurs by a reaction of O with the photoresist, which removes the photoresist from the wafer. While the photoresist stripping occurs, most of the O introduced into the stripping chamber is consumed by the reaction with the photoresist. Only a small amount is available to combine with NO to create $NO_2$ and emit light. Thus, only a small amount of light is emitted.

In a step 308, the photoresist stripping is completed. At this point substantially all of the photoresist has been removed from the wafer. Since the photoresist has been removed, the O no longer primarily reacts with the photoresist. As seen in a step 310, the O is now available to combine with NO to create $NO_2$ and emit light. The increased availability of O increases the reaction of O and NO to create $NO_2$ and light. Thus, the intensity of emitted light increases. This increase in emitted light is a visible signal, as seen in a step 312. The signal is observed and used to signal the endpoint of the photoresist stripping process in a step 314.

Figure 4:
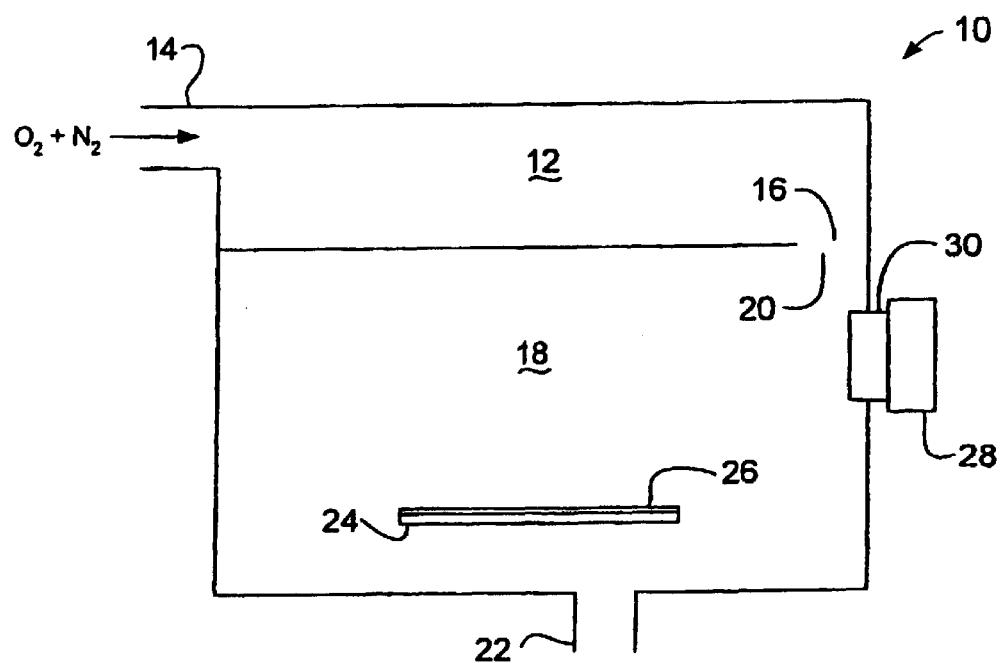
FIG. 4 is a schematic view of a first embodiment.

FIG. 4 is a schematic view of a first embodiment of an apparatus 10. A plasma chamber 12 comprises an inlet 14 and an outlet 16. In a preferred embodiment, a flow of $O_2$ and $N_2$ enters the plasma chamber 12 through the plasma chamber inlet 14. Within the plasma chamber 12, the $O_2$ and $N_2$ are dissociated so that NO and O are formed. The flow of NO and O exits the plasma chamber 12 through the plasma chamber outlet 16. A stripping chamber 18 comprises an inlet 20 and an outlet 22. The plasma chamber outlet 16 is in fluid communication with the stripping chamber inlet 20. Thus, the flow of NO and O enters the stripping chamber 18 as it leaves the plasma chamber 12. Substantially no plasma enters the stripping chamber 18 from the plasma chamber 12, only uncharged gas.

A wafer 24, at least partially coated with a layer of photoresist 26, is disposed inside the stripping chamber 18. As the flow of O and NO passes through the stripping chamber 18, the O reacts with the layer of photoresist 26 and removes the layer of photoresist 26 from the wafer 24. Inside the stripping chamber 18, O reacts with NO to form $NO_2$ and emit light. However, while the layer of photoresist 26 remains on the wafer 24, much of the O is consumed by reacting with the layer of photoresist 26. Little O is left over to react with NO, so little light is emitted. When the layer of photoresist 26 is substantially entirely removed from the wafer 24, the O is no longer consumed by a reaction with the layer of photoresist 26. The O now reacts with NO. More O reacts with NO after the layer of photoresist 26 is removed, so more light is emitted from the reaction of O and NO to form $NO_2$. Therefore, the amount of emitted light increases after the layer of photoresist 26 has been essentially entirely removed.

A detecting apparatus 28 detects the level of light emitted by the reaction of O and NO to form $NO_2$ and emit light. In a preferred embodiment, the detecting apparatus 28 detects the light through a window 30. However, there are many ways to arrange the detecting apparatus 28 so that it can detect the emitted light. In a preferred embodiment, the light emissions from the reaction of O and NO to form $NO_2$ are summed over the wavelength range of 470–770 nm while detecting intensity levels.

Figure 5:
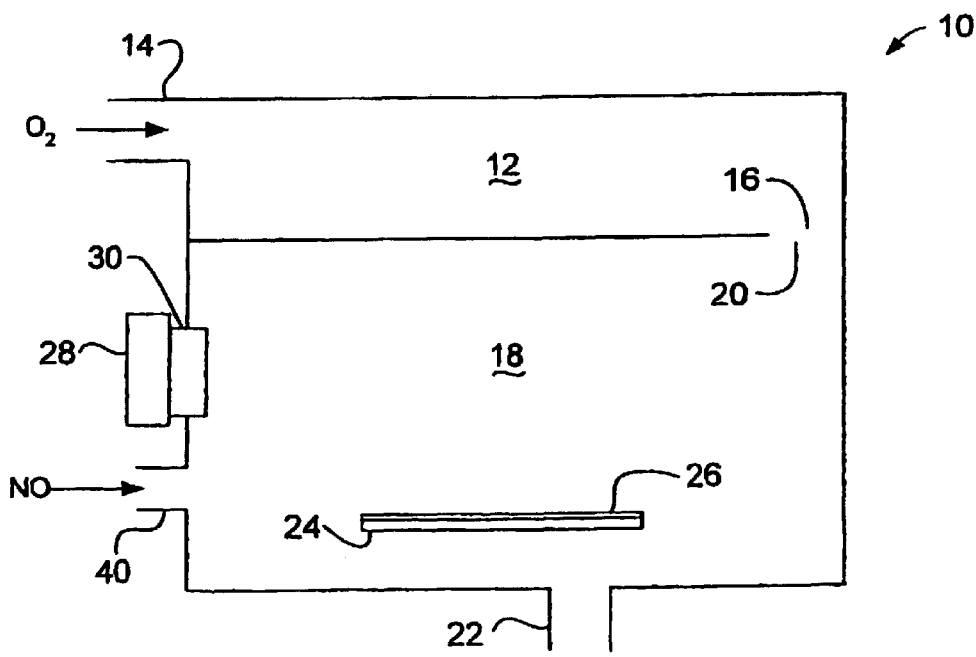
FIG. 5 is a schematic view of a second embodiment.

FIG. 5 is a schematic view of a second embodiment of the apparatus 10. In this embodiment, a flow of $O_2$ enters the plasma chamber 12 through the plasma chamber inlet 14. Within the plasma chamber 12, the $O_2$ is dissociated so that O is formed. The flow of O exits the plasma chamber 12 through the plasma chamber outlet 16. The flow of O enters the stripping chamber 18 as it leaves the plasma chamber 12. Substantially no plasma enters the stripping chamber 18 from the plasma chamber 12, only uncharged gas. A separate input 40 to the stripping chamber 18 is provided to supply a flow of NO to the stripping chamber 18.

In the embodiment shown in FIG. 5, the window 30 and detecting apparatus 28 are placed close to the NO input, to aid detection of the light emitted in the reaction of O and NO. The detecting apparatus 28 detects the intensity of light emitted by the reaction of O and NO to form $NO_2$, just as in the embodiment shown in FIG. 4.

Figure 6:
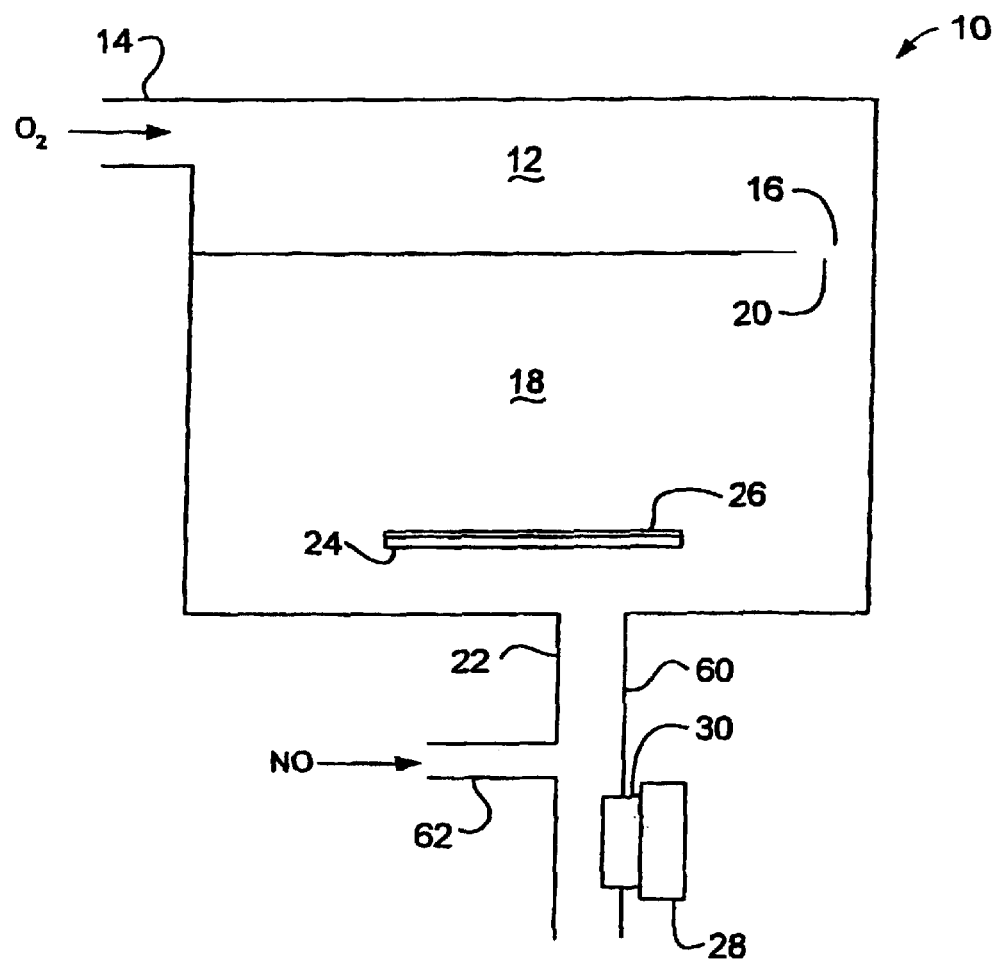
FIG. 6 is a schematic view of a third embodiment.

FIG. 6 is a schematic view of a third embodiment of the apparatus 10. In this embodiment, the reaction of NO and O to produce $NO_2$ and light does not occur within the stripping chamber 18. In this embodiment, a flow of $O_2$ enters the plasma chamber 12 and is dissociated so that a flow of O enters the stripping chamber 18, while substantially no plasma enters the stripping chamber 18. Substantially no NO exists in the stripping chamber 18, so the level of light emitted inside the stripping chamber 18 from the reaction of O and NO to form $NO_2$ is essentially zero. As a flow of O leaves the stripping chamber 18 through the stripping chamber outlet 22, it enters a downstream channel 60. A flow of NO in introduced into the downstream channel 60 through an inlet 62 into the downstream channel 60. In the downstream channel 60, the flow of NO and the flow of O react to produce $NO_2$ and light. This light in the downstream channel 60 is detected by the detecting apparatus 28. Preferably, the detecting apparatus detects the light through a window 30 in the downstream channel 60, although there are many ways to arrange the detecting apparatus to detect the emitted light. The window 30 and detecting apparatus 28 are preferably located close to the inlet 60 into the downstream channel 60 to aid in detecting the light emitted in the reaction of O and NO.

Figure 7:
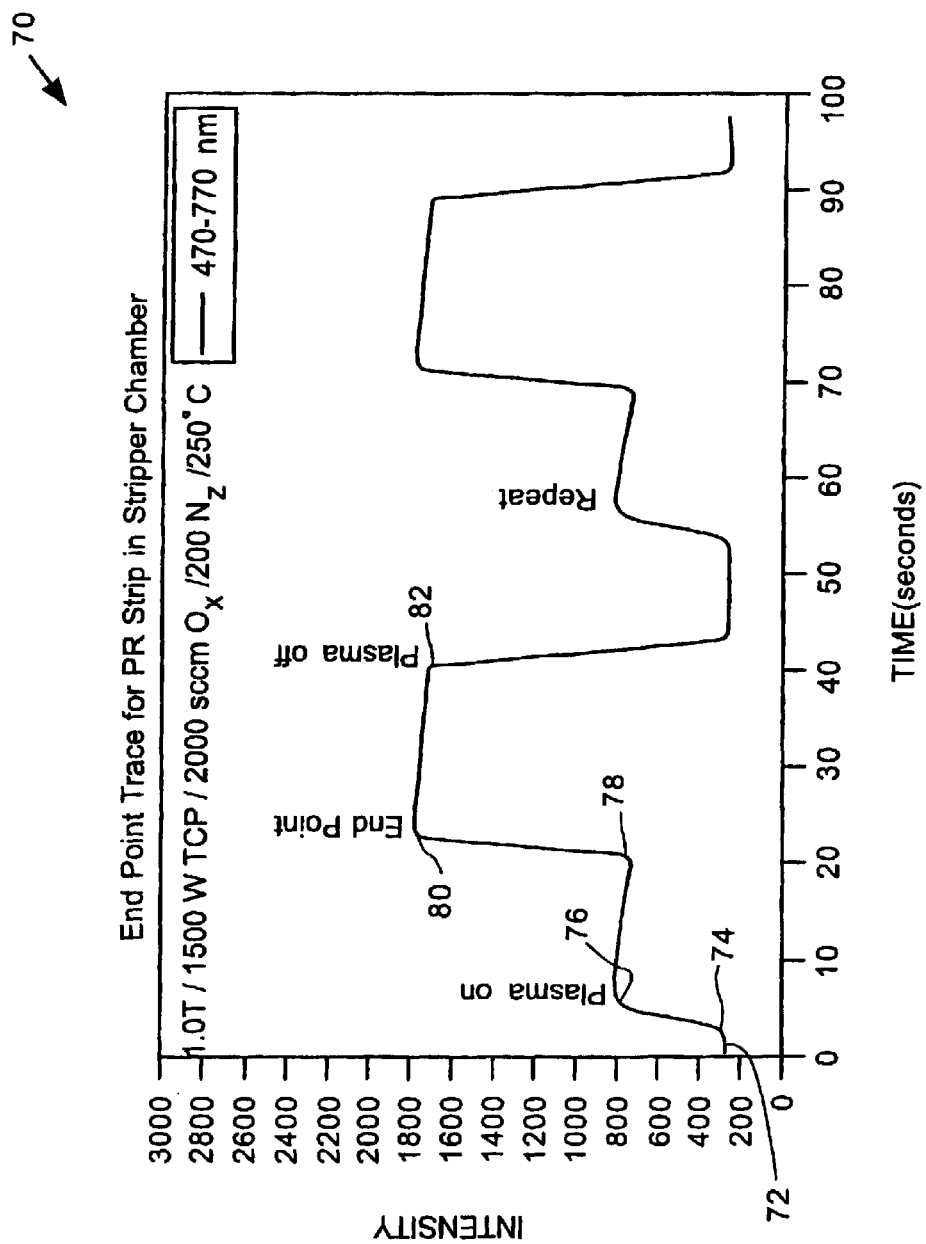
FIG. 7 is a graph showing the intensity of light detected from the reaction of O and NO.

FIG. 7 is a graph 70 showing the intensity of light detected from the reaction of O and NO during a preferred embodiment of the photoresist stripping process. The intensity levels on the graph 70 represent the summation of the intensity of light over the range of 470–770 nm. At a first time 72, the photoresist stripping process has not begun and the light detected is at a low level. At a time 74, the photoresist stripping process begins, and a flow of O and NO enters the stripping chamber. Some of the O and NO reacts to form $NO_2$ and emit light. As can be seen in the graph 70, the intensity of light detected increases after O and NO enter the chamber at a time 74 until the intensity reaches a higher level at a time 76. From a time 76 to a later time 78, much of the O reacts with the photoresist, and is not available to react with NO. At a time 78, substantially no photoresist remains on the wafer, and the O is now free to react with the NO. Thus from a time 78 to a later time 80, the intensity of light detected greatly increases, more than doubling in intensity. This increase signals the endpoint of the photoresist stripping at a time 80. The photoresist stripping process and the flow of NO and O continues until a time 82 to ensure essentially all the photoresist has been stripped from the wafer. At a time 82, the flow of O and NO into the stripping chamber ends, and the intensity of light detected returns to a low level.

Although only a few embodiments have been described in detail herein, it should be understood that the described method and apparatus may be embodied in many other specific forms without departing from the spirit or scope of the invention. Therefore, the present examples and embodiments are to be considered as illustrative and not restrictive, and the method and apparatus are not to be limited to the details given herein, but may be modified within the scope of the appended claims.

What is claimed is:

1. A method for detecting an endpoint of a photoresist stripping process, the method comprising the operations of:
   performing a first reaction in a chamber to strip photoresist from a wafer disposed inside the chamber, the first reaction being between the photoresist and a first gas;
   detecting a first intensity of light emitted from the first reaction;
   providing a second gas for a second reaction with the first gas, the second reaction not including the photoresist, the second reaction producing light of a second intensity; and
   using a change in the intensity of the light emitted from the first and second reactions to detect the endpoint of the photoresist stripping process.

2. A method for detecting an endpoint of a photoresist stripping process, the method comprising the operations of:
   stripping photoresist from a wafer disposed inside a chamber;
   introducing a flow of O and a flow of NO into the chamber;
   detecting an intensity of light emitted; and
   using a change in the intensity of the light emitted to detect the endpoint of the photoresist stripping process.

3. A method as recited in claim 2, wherein the emitted light is emitted in a reaction of NO and O to form $NO_2$.

4. A method as recited in claim 2, wherein the O reacts with the photoresist to strip the photoresist from the wafer.

5. A method as recited in claim 2, wherein the operation of detecting a change in the intensity of light emitted further comprises detecting an increase in the intensity of light emitted from a reaction of NO and O.

6. A method as recited in claim 5, wherein the increase in intensity of the light emitted from the reaction of NO and O signals the endpoint of the photoresist stripping process.

7. A method as recited in claim 5, wherein the emitted light detected is in the wavelength range of about 470 nm to about 770 nm.

8. A method as recited in claim 5, wherein a wall of the chamber includes a window, the intensity of the light emitted being detected through the window by a light detecting apparatus.

9. A method for detecting an endpoint of a photoresist stripping process, the method comprising the operations of:
   stripping photoresist from a wafer disposed inside a chamber;
   introducing a flow of O into the chamber;
   providing an outlet from the chamber;
   providing a downstream channel, the downstream channel being in fluid communication with the chamber outlet;
   introducing a flow of NO into the downstream channel;
   detecting an increase in intensity of the light emitted from a reaction of NO and O; and
   using the increase in intensity of the light emitted from the reaction of NO and O to detect the endpoint of the photoresist stripping process.

10. A method as recited in claim 9, wherein a wall of the downstream channel includes a window, the intensity of the light emitted being detected through the window by a light detecting apparatus.

11. A method for monitoring a photoresist stripping process, comprising the operations of:
   providing a stripping chamber with a first inlet and an outlet;
   providing a wafer at least partially coated with a photoresist layer;
   providing a detecting apparatus operable to detect an intensity of light;
   disposing the wafer within the stripping chamber;
   introducing a flow of O into the stripping chamber through the first inlet, wherein the O reacts with the photoresist layer to strip the photoresist layer from the wafer, wherein upon completion of the stripping of the photoresist layer from the wafer the O in the flow does not react with the photoresist layer;
   providing a flow of NO for reaction with the O not reacted with the photoresist layer;

using the detecting apparatus to detect a change in the intensity of light emitted from the reaction of NO and O to form $NO_2$; and using the change in intensity of the light emitted from the reaction of NO and O to form $NO_2$ to monitor the photoresist stripping process.

12. A method as recited in claim 11, wherein the operation of providing the flow of NO flows the NO into the chamber through the first inlet, wherein an increase in the intensity of the light emitted from the reaction of NO and O to form $NO_2$ signals the endpoint of the photoresist stripping process.

13. A method as recited in claim 12, wherein a wall chamber includes a window, the intensity of the light emitted the window by the light detecting apparatus.

14. A method as recited in claim 11, wherein the operation of the flow of NO flows the NO into the chamber through a second inlet, wherein an increase in the intensity of light emitted from the reaction of NO and O to form $NO_2$ signals the endpoint of the photoresist stripping process.

15. A method as recited in claim 14, wherein a wall of the chamber includes a window near the second inlet, the intensity of the light emitted being detected through the window by the light detecting apparatus.

16. A method as recited in claim 11, wherein the operation of providing the flow of NO flows the NO into a downstream channel in fluid communication with the chamber outlet and wherein an increase in the intensity of the light emitted from the reaction of NO and O to form $NO_2$ signals the endpoint of the photoresist stripping process.

17. A method as recited in claim 16, wherein a wall of the downstream channel includes a window, the intensity of the light emitted being detected through the window by the light detecting apparatus.

18. A method for detecting an endpoint in a process of stripping photoresist from a wafer, the method comprising the operations of:

performing a first reaction of a first gas and the photoresist to strip the photoresist from the wafer, the first reaction emitting first light having a first intensity;

performing a second reaction between a second gas and the first gas supplied for the first reaction and not reacted with the photoresist, upon completion of the first reaction the second reaction emitting second light having a second intensity that differs substantially from the first intensity; and detecting the intensities of the first and second lights to provide an indication as to when to stop the stripping process.

19. A method as recited in claim 18, further comprising the operation of: dissociating $O_2$ to supply the first gas for the first reaction.

20. A method as recited in claim 18, further comprising the operation of:

collecting the first gas that was supplied to the stripping chamber and that did not react with the photoresist; and supplying the second gas to the collected first gas to facilitate performing the second reaction.

21. A method as recited in claim 20, wherein:

the operation of supplying the second gas to facilitate performing the second reaction also emits a range of wavelengths of the second light; and the detecting operation detects the intensities of all of the wavelengths of the range to provide the indication as to when to stop the stripping process.

22. A method for detecting an endpoint in a process of stripping photoresist from a wafer, the method comprising the operations of:

performing the stripping process by a first reaction of O and the photoresist to strip the photoresist from the wafer, first light having a first intensity being emitted during the first reaction;

supplying NO to facilitate an end point detection process between the O supplied to the stripping chamber and not reacted with the photoresist and the NO, upon completion of the first reaction the end point detection process emitting second light having a second intensity that differs substantially from the first intensity; and detecting the intensities of the first light and the second light to provide an indication of the endpoint.

23. A method as recited in claim 22, further comprising the operations of:

dissociating $O_2$ to form the O for the first reaction.

24. A method as recited in claim 22, further comprising the operations of:

separately from the first reaction, receiving the O supplied for the first reaction and not reacted with the photoresist; and supplying the NO to the received O supplied for the first reaction and not reacted with the photoresist to facilitate, separately from the first reaction, the end point detection process between the NO and the O supplied to the stripping chamber and not reacted with the photoresist.

25. A method as recited in claim 22, wherein:

the end point detection process emits the second light having a range of wavelengths; and the detecting operation detects the intensities of all of the wavelengths of the range to provide the indication of the endpoint.

* * * * *